US012575120B2

(12) United States Patent
Meyer et al.

(10) Patent No.: US 12,575,120 B2
(45) Date of Patent: Mar. 10, 2026

(54) DEPOSITING A STORAGE NODE

(71) Applicant: Micron Technology, Inc., Boise, ID (US)

(72) Inventors: Ryan L. Meyer, Boise, ID (US); Vinay Nair, Boise, ID (US); Andrea Gotti, Boise, ID (US); Kevin Shea, Boise, ID (US); Kyle R. Knori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 759 days.

(21) Appl. No.: 17/726,965

(22) Filed: Apr. 22, 2022

(65) Prior Publication Data

US 2023/0343815 A1 Oct. 26, 2023

(51) Int. Cl.
*H10D 1/68* (2025.01)
*H10B 12/00* (2023.01)

(52) U.S. Cl.
CPC ............. *H10D 1/692* (2025.01); *H10B 12/03* (2023.02)

(58) Field of Classification Search
CPC ........ H01L 21/76802; H01L 21/02129; H10B 12/03; H10B 12/033; H10D 1/042; H10D 1/692; H10D 1/716
See application file for complete search history.

(56) References Cited

U.S. PATENT DOCUMENTS

| | | | | |
|---|---|---|---|---|
| 6,624,020 B2 * | 9/2003 | Mori | .................. | H10B 12/09 |
| | | | | 257/E21.018 |
| 10,607,995 B2 | 3/2020 | Roberts et al. | | |
| 10,811,419 B1 * | 10/2020 | Shreeram | ............... | H10B 12/37 |
| 10,825,691 B1 * | 11/2020 | Lee | .................. | H01L 21/0217 |
| 2008/0111212 A1 * | 5/2008 | Wu | .................. | H01L 28/91 |
| | | | | 257/532 |
| 2018/0323200 A1 | 11/2018 | Tang et al. | | |
| 2019/0081134 A1 * | 3/2019 | Chang | ................... | H10D 1/716 |
| 2019/0103406 A1 | 4/2019 | Tang et al. | | |
| 2019/0164985 A1 | 5/2019 | Lee et al. | | |
| 2020/0243640 A1 * | 7/2020 | Tran | .................... | H10B 12/038 |
| 2021/0013226 A1 | 1/2021 | Tang et al. | | |

* cited by examiner

*Primary Examiner* — Meiya Li
(74) *Attorney, Agent, or Firm* — Brooks, Cameron & Huebsch, PLLC

(57) ABSTRACT

Methods, apparatuses, and systems related to depositing a storage node material are described. An example method includes forming a semiconductor structure including a support structure having a first silicate material over a bottom nitride material, a first nitride material over the first silicate material, a second silicate material over the first nitride material, and a second nitride material over the second silicate material. The method further includes removing portions of the second nitride material. The method further includes depositing a third silicate material over the second nitride material and a portion of the second silicate material. The method further includes forming an opening through the semiconductor structure. The method further includes depositing a storage node material within the opening.

15 Claims, 10 Drawing Sheets

DEPOSITING A STORAGE NODE

TECHNICAL FIELD

The present disclosure relates generally to semiconductor devices and methods, and more particularly to depositing a storage node.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
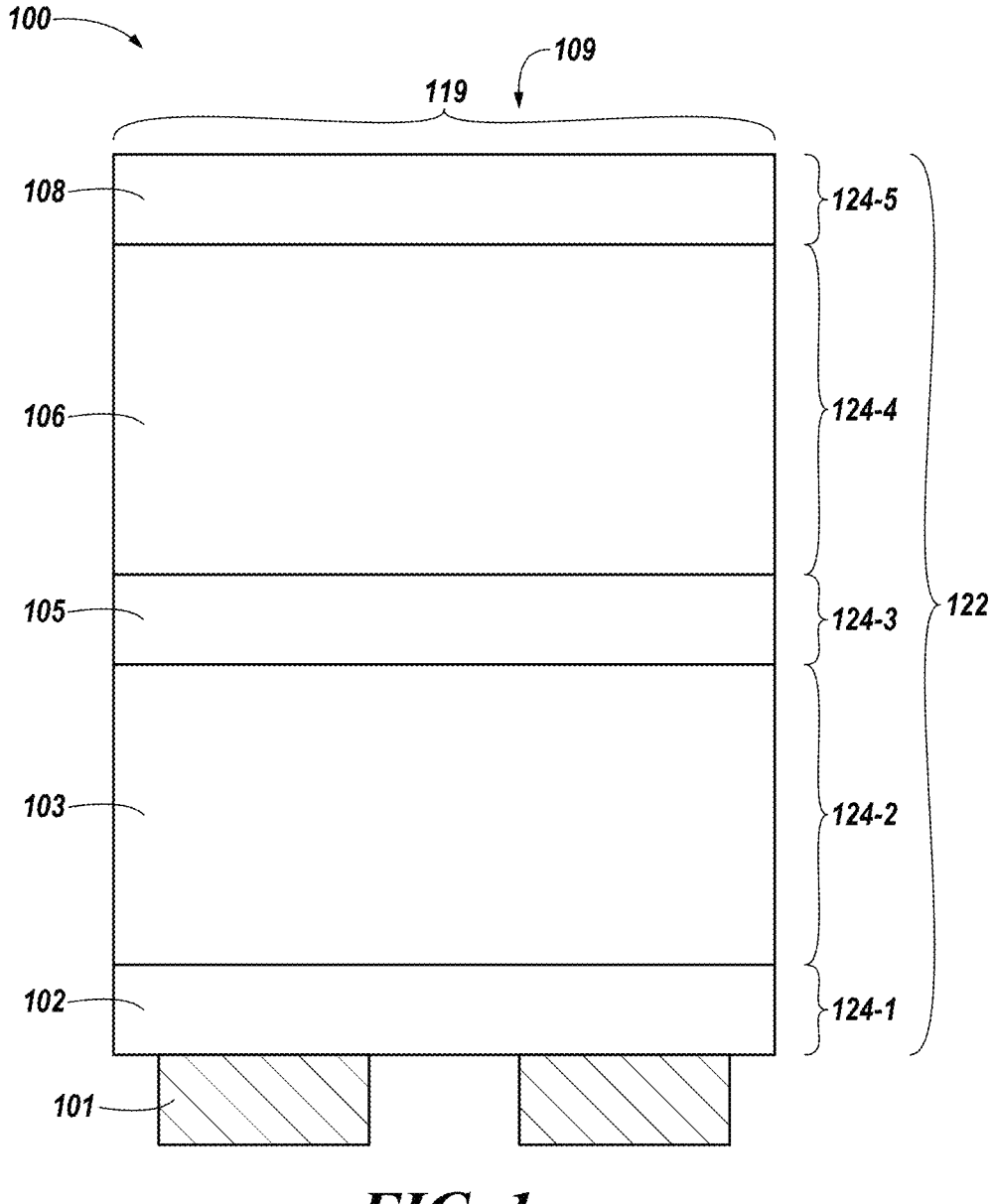
FIG. 1 illustrates a cross-sectional view of a portion of a semiconductor structure of a memory device associated with a semiconductor fabrication sequence for formation of a semiconductor structure in accordance with a number of embodiments of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device. As an example, capacitor material may be deposited into these openings to provide the data access, storage, and/or processing.

Semiconductor support structures are typically formed with lattice support materials and sacrificial materials. Openings may be formed through the semiconductor support structure and alongside the lattice support materials. In some previous approaches, the lattice support material may be etched after a storage node material has been deposited within the openings. This may result in a top portion of the storage node being etched and damaged. This damage to the top of the storage node may lead to reduced structural stability, a loss in cell capacitance and a higher potential for shorts, pillar wobbling and/or bending, and the sputter of metal rich etch byproducts.

In contrast, in order to mitigate this issue, a method for depositing a storage node is described further below. As an example, a top nitride lattice material may be etched prior to depositing a storage node. This can be accomplished by depositing a pattern of materials including silicate and nitride materials, where the nitride materials can be a nitride lattice material. A top nitride lattice material of the pattern of materials may be etched and topped with silicate material. Openings may be formed through the pattern of materials, including the nitride lattice material, and a storage node material may be deposited within the opening. The non-lattice materials of the pattern of materials may then be etched and removed. In this way, the top portion of the storage node is prevented from being etched away when the top lattice material is etched.

The present disclosure includes methods, apparatuses, and systems related to depositing a storage node material are described. An example method includes forming a semiconductor structure including a pattern of materials including a first silicate material over a bottom nitride material, a first nitride material over the first silicate material, a second silicate material over the first nitride material, and a second nitride material over the second silicate material. The method further includes removing portions of the second nitride material. The method further includes depositing a third silicate material over the second nitride material and a portion of the second silicate material. The method further includes forming an opening through the semiconductor structure. The method further includes depositing a storage node material within the opening.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 409-1, 409-2, 409-N in FIG. 4). Further, the plurality of similar elements referenced sequentially with the same element number (e.g., 409-1, 409-2, 409-N in FIG. 4) may be all referenced together as a single plurality (e.g., 409).

FIG. 1 illustrates a cross-sectional view of a portion of a semiconductor structure 100 of a memory device in association with a semiconductor fabrication sequence for formation of a semiconductor structure in accordance with a number of embodiments of the present disclosure. The example semiconductor support structure 109 may include a bottom nitride material 102, shown to have been formed over a redistribution layer (RDL) material 101. The RDL material 101 may be a copper metal interconnect layer that electrically connects one part of the semiconductor package to another. The bottom nitride material 102 may be formed from various undoped or doped materials on which memory device materials may be fabricated. The bottom nitride material 102 may be formed over a surface of the RDL material 101. The bottom nitride material 102 may be formed (e.g., deposited) over an upper surface of the RDL material 101. The bottom nitride material 102 may be formed from a nitride material selected for dielectric properties. For example, one or more dielectric nitrides may be selected from silicon nitride ($SiN_X$, $Si_3N_4$), aluminum nitride (AlN), among other possibilities.

The first silicate material 103 may be originally formed (e.g., deposited) over a surface of the bottom nitride material 102. For example, the first silicate material 103 may be formed on the bottom nitride material 102. The first silicate material 103 may, in a number of examples, be deposited to a thickness in a range of approximately 400 nanometers (nm) to approximately 600 nm above the surface of the RDL material 101. However, embodiments of the present disclosure are not limited to this example.

The first silicate material 103 may, in a number of examples, have been formed from borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, and/or formation of the first silicate material 103, as described herein.

A first nitride material 105 may be formed over a surface of the first silicate material 103 opposite from the bottom nitride material 102. The first nitride material 105 may be formed (e.g., deposited) over an upper surface of the first silicate material 103. The first nitride material 105 may be formed from a nitride material selected for dielectric properties. For example, one or more dielectric nitrides may be selected from silicon nitride ($SiN_X$, $Si_3N_4$), aluminum nitride (AlN), among other possibilities, for formation of the first nitride material 105. The first nitride material 105 may, in a number of examples, be deposited to a thickness in a range of approximately 10 nm to approximately 100 nm above the surface of the first silicate material 103. However, embodiments of the present disclosure are not limited to this example.

A second silicate material 106 is formed over a surface of the first nitride material 105 opposite from the first silicate material 103. The second silicate material 106 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. The second silicate material 106 may, in a number of examples, be deposited to a thickness in a range of approximately 200 nm to 600 nm above the surface of the first nitride material 105. However, embodiments of the present disclosure are not limited to this example.

A second nitride material 108 is formed over a surface of the second silicate material 106 opposite from the first nitride material 105. The second nitride material 108 may be formed (e.g., deposited) over an upper surface of the second silicate material 106.

Similar to the first nitride material 105, the second nitride material 108 may be formed from a nitride material selected for dielectric properties. For example, the second nitride material 108 may be formed from the same material as the first nitride material 105. The second nitride material 108 may, in a number of examples, be deposited to a thickness in a range of from approximately 10 nm to approximately 150 nm above the surface of the second silicate material 106. The bottom nitride material 102, first nitride material 105, and second nitride material 108 may form lattice support structure for the semiconductor support structure 109.

In at least one example, the width 119 of the semiconductor support structure 109 may be within a range of approximately 200-600 Angstroms (or 20 to 60 nm). The overall height 122 of the semiconductor support structure 109 may be formed to a height of greater than 10,000 Angstroms. For example, the overall height 122 of the semiconductor support structure 109 may be within a range of approximately 10,000-15,000 Angstroms (1,000-1,500 nm) and may result in an aspect ratio (AR) of the height to width being in a range of approximately 25:1 to approximately 50:1.

Each of the semiconductor support structure 109 may contribute a particular height to the overall height 122. As is illustrated in FIG. 1, the bottom nitride material 102 can have a height 124-1, the first silicate material 103 can have a height 124-2, the first nitride material 105 can have a height 124-3, the second silicate material 106 can have a height 124-4, and the second nitride material 108 can have a height 124-5 that, when added together, results in the overall height 122.

Figure 2:
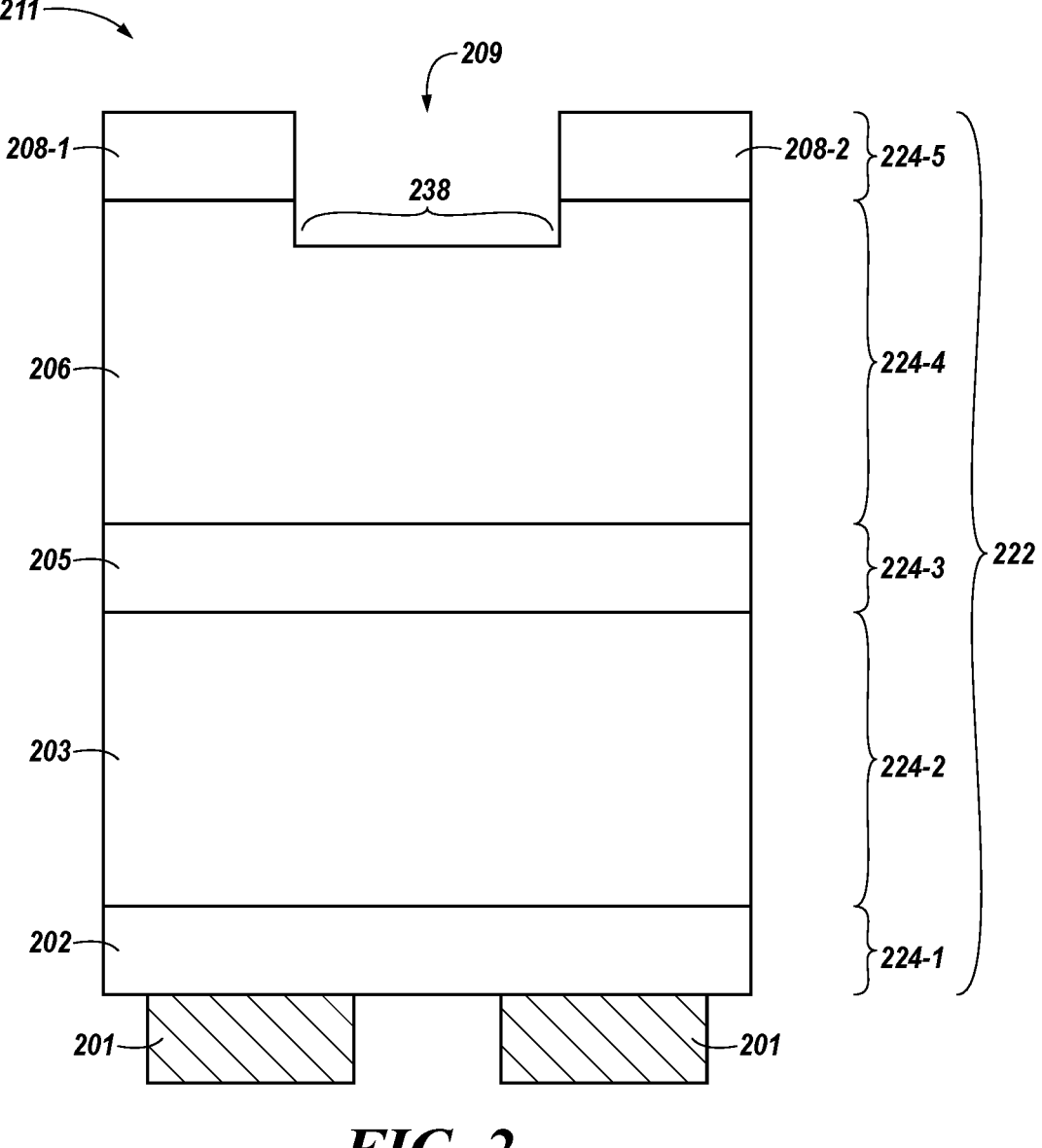
FIG. 2 illustrates a cross-sectional view of a portion of a semiconductor structure of a memory device associated with a semiconductor fabrication sequence for removal of a portion of nitride material in accordance with a number of embodiments of the present disclosure.

FIG. 2 illustrates a cross-sectional view 211 of a portion of an example semiconductor structure of a memory device associated with a semiconductor fabrication sequence for removal of a portion of nitride material in accordance with a number of embodiments of the present disclosure. FIG. 2 illustrates the example semiconductor structure at the particular stage following completion of the example fabrication sequence described in connection with FIG. 1.

The cross-sectional view 211 can include the same or similar elements as the example cross-sectional view as referenced in FIG. 1. For example, RDL material 201 is analogous or similar to RDL material 101. Bottom nitride material 202 is analogous or similar to bottom nitride material 102, first silicate material 203 is analogous or similar to first silicate material 103, first nitride material 205 is analogous or similar to first nitride material 105, second silicate material 206 is analogous or similar to second silicate material 106, second nitride material 208 is analogous or similar to second nitride material 108, and semiconductor support structure 209 is analogous or similar to semiconductor support structure 109.

After the completion of the formation of the semiconductor support structure 209, an etch process (e.g., a wet etch process or dry etch process) may be utilized to remove portions of the second nitride material 208. The etch process may result in second nitride material 208 to be split into two portions (e.g., second nitride material 208-1 and second nitride material 208-2, collectively known as second nitride material 208) as portions of the second nitride material 208 are removed. The portions of the second nitride material 208 may be removed with (via application of) a solvent that is selective only to the second nitride material 208. For example, the portions of the second nitride material 208 may be removed with (via application of) a solvent that etches through the second nitride material 208 while not removing (e.g., leaving) other materials such that the second silicate material 206, the first nitride material 205, the first silicate material 203, and the bottom nitride material 202 remain untouched (e.g., unetched) and/or less etched. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities.

Removal of the second nitride material 208 may form an opening 238 within the second nitride material 208. The opening 238 may be a first opening through only second nitride material 208. However, embodiments are not so limited. In some embodiments, the etch process may also remove portions of second silicate material 206 while removing portions of the second nitride material 208.

Figure 3:
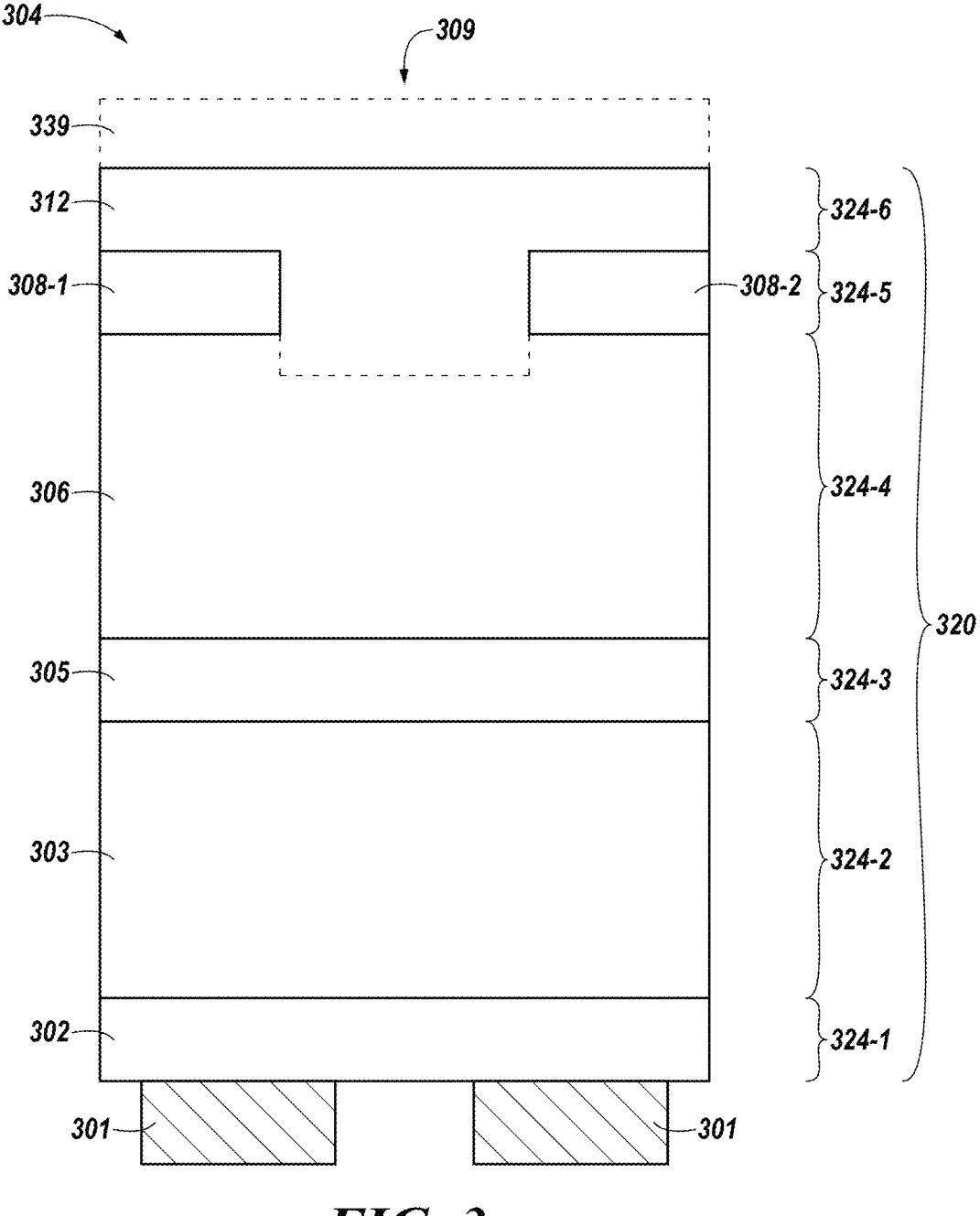
FIG. 3 illustrates a cross-sectional view of a portion of a semiconductor structure of a memory device associated with a semiconductor fabrication sequence for depositing a silicate material in accordance with a number of embodiments of the present disclosure.

FIG. 3 illustrates a cross-sectional view 304 of a portion of an example semiconductor structure of a memory device associated with a semiconductor fabrication sequence for depositing a silicate material in accordance with a number of examples of the present disclosure. FIG. 3 illustrates the example semiconductor structure at the particular stage following completion of the example fabrication sequence described in connection with FIG. 2.

The cross-sectional view 304 can include the same or similar elements as the example cross-sectional views as referenced in FIG. 1 and the example cross-sectional view 211 as referenced in FIG. 2. For example, RDL material 201 is analogous or similar to RDL material 101 and 201 of FIGS. 1 and 2, respectively. Bottom nitride material 302 is analogous or similar to bottom nitride material 102 and 202 of FIGS. 1 and 2, respectively. First silicate material 303 is analogous or similar to first silicate material 103 and 203 of FIGS. 1 and 2, respectively. First nitride material 305 is analogous or similar to first nitride material 105 and 205 of FIGS. 1 and 2, respectively. Second silicate material 306 is analogous or similar to second silicate material 106 and 206 of FIGS. 1 and 2, respectively. Second nitride material 308 is analogous or similar to second nitride material 108 and 208 of FIGS. 1 and 2, respectively. Semiconductor support structure 309 is analogous or similar to semiconductor support structures 109 and 209 of FIGS. 1 and 2, respectively.

Second nitride material 308 (individually known as second nitride material 308-1 and second nitride material 308-2) has been etched and a portion of the second nitride material 308 has been removed, as illustrated and described in association with FIG. 2 above. A third silicate material 312 may be formed (e.g., deposited) in the opening formed through the second nitride material (e.g., through second nitride material 208 in FIG. 2) to form two portions 308-1, 308-2. The third silicate material 312 may be formed over a portion of the surface of second silicate material 306 between the individual portions of the second nitride material 308-1 and the second nitride material 308-2 and over a surface of the second nitride material 308-1 and second nitride material 308-2.

In one embodiment, similar to, the third silicate material 312 may be formed from the same material as the second silicate material 306. For example, the third silicate material 312 may be formed from a silicate material. The third silicate material 312 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. In other embodiments the third silicate material 312 may be formed from an oxide material. The third silicate material 312 may, in a number of examples, be used to increase the height of the semiconductor support structure 309. The height 320 of the semiconductor support structure 309 may be increased by the height of the third silicate material. The third silicate material 312 may be deposited to a thickness of more than 100 above the surface of the second silicate material 306, the second nitride material 308-1, and second nitride material 308-2. However, embodiments of the present disclosure are not limited to this example. In other examples, the third silicate material 312 may be planarized to determine the height of the semiconductor support structure 309. The third silicate material 312 may be planarized using the chemical mechanical polishing (CMP). The CMP process may be performed to planarize the third silicate material 312 to get the semiconductor support structure 309 to a desired height.

In other examples, a third nitride material 339 may be formed (e.g., deposited) over a surface of third silicate material 312 opposite from second nitride material 308-1 and second nitride material 308-2. Similar to the first nitride material 305 and second nitride material 308, the third nitride material 339 may be formed from a nitride material selected for dielectric properties. For example, one or more dielectric nitrides may be selected from silicon nitride ($SiN_x$, $Si_3N_4$), aluminum nitride (AlN), among other possibilities, for formation of the first nitride material 105.

Figure 4:
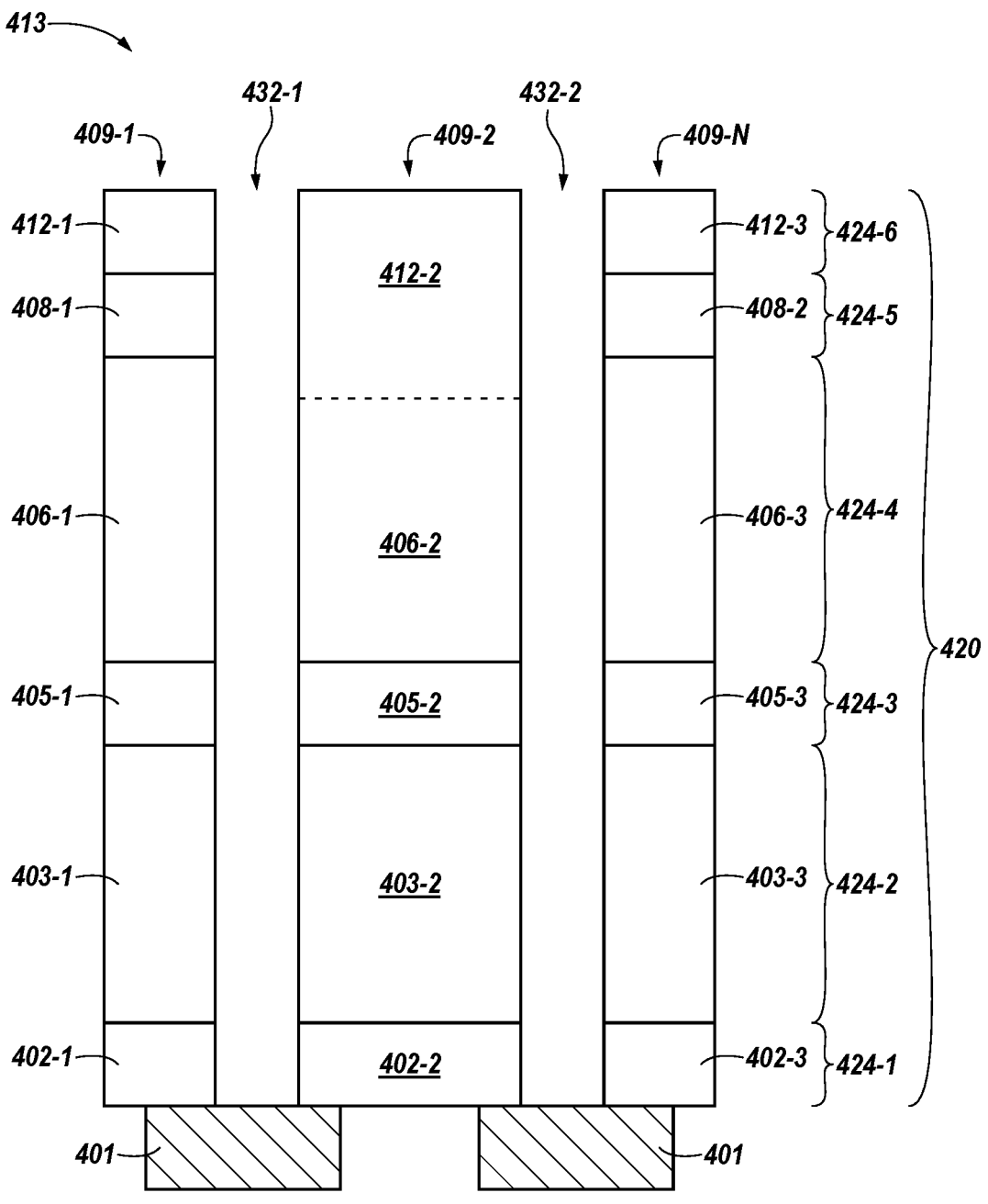
FIGS. 4-8 illustrate cross-sectional views of a portion of a semiconductor structure of a memory device in association with a semiconductor fabrication sequence for depositing of a storage node in accordance with a number of examples of the present disclosure.

FIG. 4 illustrates a cross-sectional view 413 of a portion of an example semiconductor structure of a memory device in association with a semiconductor fabrication sequence for depositing a storage node in accordance with a number of examples of the present disclosure. FIG. 4 illustrates the example semiconductor structure following completion of the example fabrication sequence described in connection with FIG. 3.

The cross-sectional view 413 can include the same or similar elements as the example cross-sectional view as referenced in FIG. 1, the example cross-sectional view 211 as referenced in FIG. 2, and the example cross-sectional view 304 as referenced in FIG. 3, respectively. For example, RDL material 401 is analogous or similar to RDL material 101, 201, and 301 of FIGS. 1, 2, and 3, respectively. The bottom nitride material 402 is analogous or similar to bottom nitride material 102, 202, and 302 of FIGS. 1, 2, and 3, respectively. First silicate material 403 is analogous or similar to first silicate material 103, 203, and 303 of FIGS. 1, 2, and 3, respectively. The first nitride material 405 is analogous or similar to first nitride material 105, 205, and 305 of FIGS. 1, 2, and 3, respectively. Second silicate material 406 is analogous or similar to second silicate material 106, 206, and 306 of FIGS. 1, 2, and 3, respectively. The second nitride material 408 is analogous or similar to second nitride material 108, 208, and 308 of FIGS. 1, 2, and 3, respectively. Third silicate material 412 is analogous or similar to third silicate material 312 of FIG. 3.

Performance of the etch process may allow for a formation of an opening (within which a column of storage node and/or silicon fill material can be deposited) that extends from the upper surface of the second silicate material 412-1, 412-2, and 412-3 to the surface of the RDL material 401, which is illustrated by height 420. An etch process (e.g., a first wet etch process or dry etch process) may be utilized to etch via (e.g., through) the third silicate material (e.g., through 312 in FIG. 3 to result in portions of third silicate material 412-1, 412-2, and 412-3), the portions of the second nitride material 408-1, 408-2, the second nitride material (e.g., through 306 in FIG. 3 resulting in portions second nitride material 406-1, 406-2, 406-3), the first nitride material (e.g., 305 in FIG. 3 resulting in portions of first nitride material 405-1, 405-2, 405-3), the first silicate material (e.g., 303 in FIG. 3 resulting in portions of the first silicate material 403-1, 403-2, 403-3), and/or the bottom nitride material (e.g., 301 in FIG. 3 resulting in portions of bottom nitride material 401-1, 401-2, 401-3) to form an opening within the previously listed materials.

The etch process may produce a plurality of openings 432-1 and 432-2 (collectively referred to as openings 432). Although FIG. 4 shows a first opening 432-1 and a second opening 432-2, examples are not limited to two openings and may include various numbers of openings. The resultant openings 432 may have the same height as the height 420 of the portions of the semiconductor support structures 409-1, 409-2, 409-3. For example, the overall height 120 of the openings 432 may be within a range of approximately 10,000-15,000 Angstroms (1,000-1,500 nm). Portions of the openings 432-1 and 432-2 may be etched through a portion of a previously etched opening (such as opening 238 in FIG. 2). As an example, the first opening 432-1 may be etched through portions of second nitride material (e.g., portions of second nitride material 308-1) and portions of third silicate material (e.g., third silicate material 312) that results in the edges of second nitride material 408-1 and third silicate material 412-1 and 412-2. Likewise, second opening 432-2 may be etched through portions of second nitride material (e.g., portions of second nitride material 308-2) and portions of third silicate material (e.g., third silicate material 312) that results in the edges of second nitride material 408-2 and third silicate material 412-2 and 412-3.

Performance of the etch process may divide the semiconductor support structure (e.g., 309 in FIG. 3) into portions of semiconductor support structures 409-1, 409-2, and 409-N (collectively referred to as plurality of semiconductor support structure 409). Each of the plurality of semiconductor support structure 409 may contain the same materials as the semiconductor support structures 109, 209, 309 in FIGS. 1-3. For example, the plurality of semiconductor support structures 409-1, 409-2, and 409-N may include bottom nitride material 402-1, 402-2, and 402-3, a first silicate material 403-1, 403-2, and 403-3, a first nitride material 405-1, 405-2, and 405-3, a second silicate material 406-1, 406-2, and 406-3, and a third silicate material 412-1, 412-2, and 412-3. In embodiments where a third nitride material is present, each of the plurality of semiconductor support structures 409 may contain a portion of the third nitride material.

Figure 5:
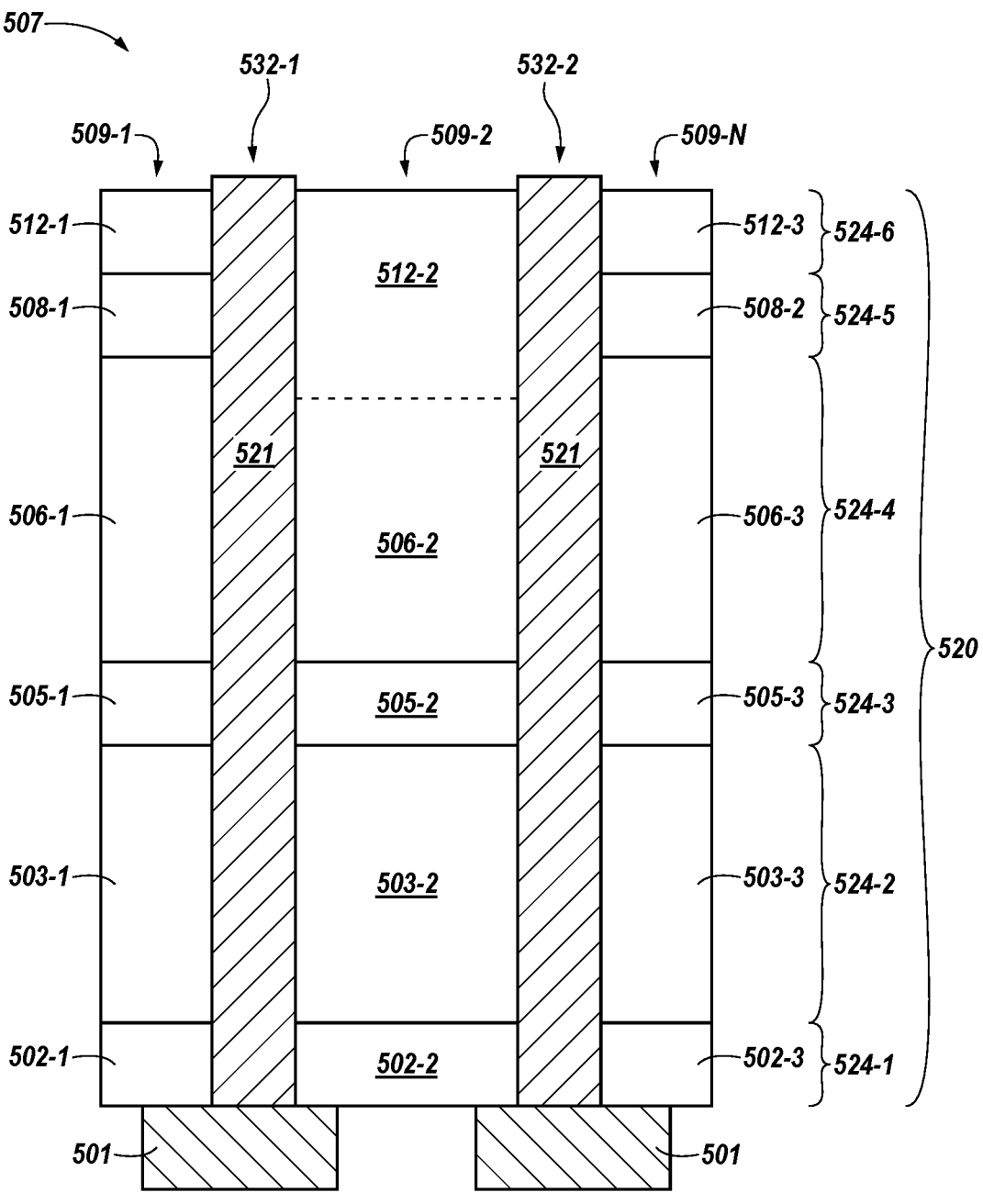

FIG. 5 illustrates a cross-sectional view 507 of a portion of an example semiconductor structure of a memory device in association with a semiconductor fabrication sequence for depositing a storage node in accordance with a number of examples of the present disclosure. FIG. 5 illustrates the example semiconductor structure following completion of the example fabrication sequence described in connection with FIG. 4.

The cross-sectional view 507 can include the same or similar elements as the example cross-sectional view as referenced in FIG. 1, the example cross-sectional view 211 as referenced in FIG. 2, the example cross-sectional view 304 as referenced in FIG. 2, and the example cross-sectional view 413 as referenced in FIG. 4. For example, RDL material 501 is analogous or similar to RDL material 101, 201, 301, and 401 of FIGS. 1, 2, 3, and 4 respectively. The bottom nitride material 502 is analogous or similar to bottom nitride material 102, 202, 302, and 402 of FIGS. 1, 2, 3, and 4 respectively. The first silicate material 503 is analogous or similar to first silicate material 103, 203, 303, and 403 of FIGS. 1, 2, 3, and 4 respectively. The first nitride material 505 is analogous or similar to first nitride material 105, 205, 305, and 405 of FIGS. 1, 2, 3, and 4 respectively. The second silicate material 506 is analogous or similar to second silicate material 106, 206, 306, and 406 of FIGS. 1, 2, 3, and 4 respectively, respectively. The second nitride material 508 is analogous or similar to second nitride material 108, 208, 308, and 408 of FIGS. 1, 2, 3, and 4 respectively. The third silicate material 512 is analogous or similar to third silicate material 312 and 412 of FIGS. 3 and 4 respectively. The plurality of semiconductor support structures 509-1, 509-2, . . . , 509-N is analogous or similar to plurality of semiconductor support structures 409-1, 409-2, . . . , 409-N of FIG. 4. The openings 532 is analogous or similar to openings 432 of FIG. 4.

A storage node material, e.g., an electrode material and/or capacitor material 521, may be formed (e.g., deposited) within the openings 532-1 and 532-2 from the upper surface of the second silicate material 512-1, 512-2, and 512-3 to the surface of the RDL material 501. The inner surfaces of the openings 532-1 and 532-2 may be covered by the storage node material 521. The storage node material 521 may be formed (e.g., deposited) to the height 520 of the openings 532-1 and 532-2 through a conformal deposition process such as chemical vapor deposition (CVD). As an example, the height 520 of the storage node material 521 spans the height 524-1 of the bottom nitride material 501, the height 524-2 of the first silicate material 503-1, 503-2, and 503-3, the height 524-3 of first nitride material 505, the height 524-4 of second silicate material 506-1, 506-2, and 506-3, the height 524-5 of the second nitride material 508-1 and 508-2, and the height 524-6 of third silicate material 512-1, 512-2, and 512-3 that, when added together, results in the overall height 520.

The storage node material 521 may be formed from a nitride compound material selected for conductive properties. For example, one or more conductive nitrides may be selected from gallium nitride (GaN), tantalum nitride (TaN, $Ta_2N$), titanium nitride (TiN, $Ti_2N$), aluminum doped titanium nitride (TiAlN), silicon doped titanium nitride (TiSiN), boron doped titanium nitride (TiBN), and tungsten nitride (WN, $W_2N$, $WN_2$), among other possibilities. In another example, the storage node material 521 may also be doped with an oxide material. The oxide material may be a ruthenium oxide (RuO) material or an Iridium oxide (IrO) material, among other possibilities. The storage node material 521 may be formed from conductive materials and to various widths (e.g., thicknesses) as suited to a particular design rule for the formation of an operable capacitor for a semiconductor device.

Figure 6:
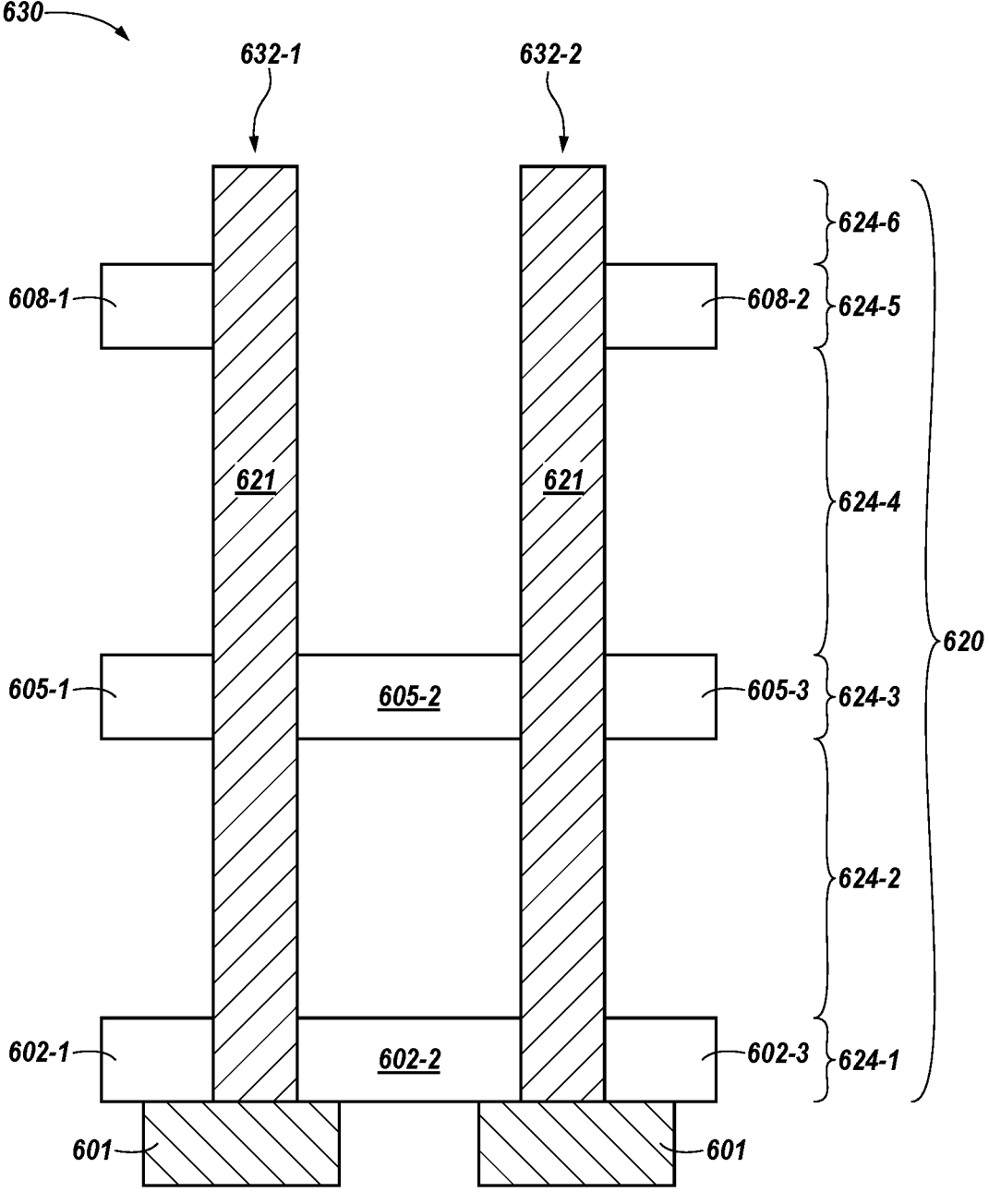

FIG. 6 illustrates a cross-sectional view 630 of a portion of an example semiconductor structure of a memory device in association with a semiconductor fabrication sequence for shaping of a storage node in accordance with a number of examples of the present disclosure. FIG. 6 illustrates the example semiconductor structure at the particular stage following completion of the example fabrication sequence described in connection with FIG. 1.

The cross-sectional view 630 can include the same or similar elements as the example cross-sectional view as referenced in FIG. 1, the example cross-sectional view 211 as referenced in FIG. 2, the example cross-sectional view 304 as referenced in FIG. 3, the example cross-sectional view 413 as referenced in FIG. 4, and the example cross-sectional view 507 as referenced in FIG. 5. For example, RDL material 601 is analogous or similar to RDL material 101, 201, 301, 401, and 501 of FIGS. 1, 2, 3, 4, and 5 respectively. The bottom nitride material 602 is analogous or similar to bottom nitride material 102, 202, 302, 402, and 502 of FIGS. 1, 2, 3, 4, and 5 respectively. The first nitride material 605 is analogous or similar to first nitride material 105, 205, 305, 405, and 505 of FIGS. 1, 2, 3, 4, and 5 respectively. The second nitride material 608 is analogous or similar to second nitride material 108, 208, 308, 408, and 508 of FIGS. 1, 2, 3, 4, and 5 respectively. The openings 632 is analogous or similar to openings 432 and 532 of FIGS. 4 and 5 respectively. The storage node material 621 is analogous or similar to storage node material 521 of FIG. 5.

After the deposition of the storage node material 621 (as detailed in FIG. 5), the first silicate material shown at 103, 203, 303, 403, and 503 of FIGS. 1, 2, 3, 4, and 5 respectively, the second silicate material shown at 106, 206, 306, 406, and 506 of FIGS. 1, 2, 3, 4, and 5, respectively, and third silicate material shown at 312, 412, and 512 of FIGS. 3, 4, and 5, respectively, may be etched and recessed from the plurality of semiconductor support structures (e.g., 509-1, 509-2, and 509-N in FIG. 5). The first, second, and third silicate materials (e.g., 503, 506, and 512 in FIG. 5) may be removed with (via application of) a solvent that is selective for removing (e.g., dissolving) the first, second, and third silicate materials (e.g., 503, 506, and 512 in FIG. 5) from the plurality of semiconductor support structures (e.g., 509-1, 509-2, and 509-N in FIG. 5) while not removing (e.g., leaving) other materials such that the nitride lattice materials (e.g., bottom nitride material 602-1, 602-2, and 602-3, first nitride material 605-1, 605-2, and 605-3, and second nitride material 608-1 and 608-2) remain on the plurality of semiconductor support structures (e.g., 509-1, 509-2, and 509-N in FIG. 5). Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the first, second and third silicate materials may leave empty spaces (e.g., voids) in the semiconductor structure during the fabrication process.

In addition, the bottom nitride material 602-1, 602-2, and 602-3, the first nitride material 605-1, 605-2, and 605-3, and the second nitride material 608-1 and 608-2 may be left remaining following the application of the selective solvent, among other possible components or structural features that may remain in the semiconductor structure. The remaining bottom nitride material 602-1, 602-2, and 602-3, first nitride material 605-1, 605-2, and 605-3, and second nitride material 608-1 and 608-2 may function as a capacitor support structure, to provide support in view of the empty spaces in the semiconductor structure during the fabrication process.

Figure 7:
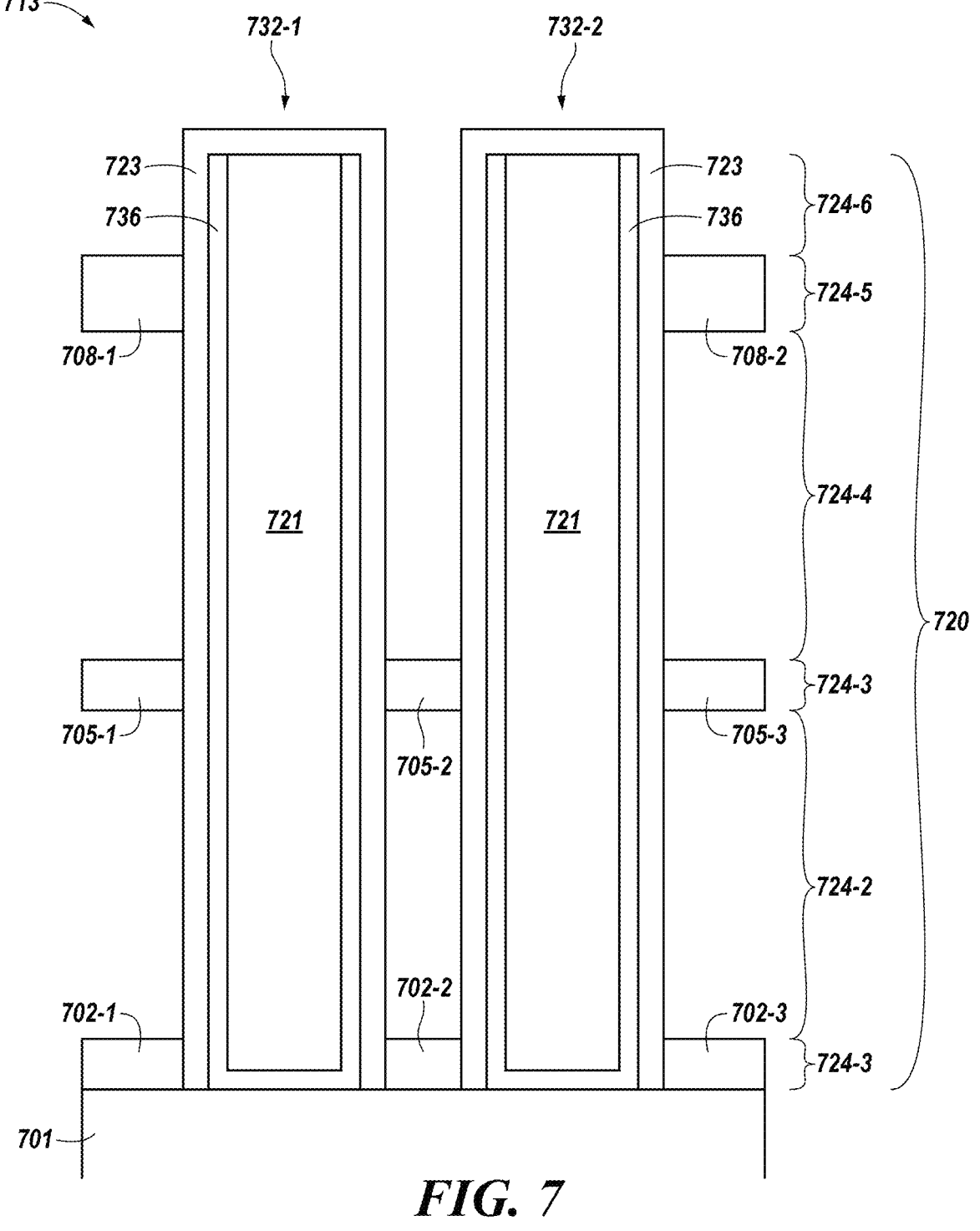

FIG. 7 illustrates a cross-sectional view 713 of a portion of an example semiconductor structure of a memory device in association with a semiconductor fabrication sequence for shaping of a storage node in accordance with a number of examples of the present disclosure. FIG. 7 illustrates the example semiconductor structure at the particular stage following completion of the example fabrication sequence described in connection with FIG. 6.

The cross-sectional view 713 can include the same or similar elements as the example cross-sectional view as referenced in FIG. 1, the example cross-sectional view 211 as referenced in FIG. 2, the example cross-sectional view 304 as referenced in FIG. 3, the example cross-sectional view 413 as referenced in FIG. 4, the example cross-sectional view 507 as referenced in FIG. 5, and the example cross-sectional view 630 as referenced in FIG. 6. For example, RDL material 701 is analogous or similar to RDL material 101, 201, 301, 401, 501 and 601 of FIGS. 1, 2, 3, 4, 5, and 6 respectively. For example, bottom nitride material 702 is analogous or similar to bottom nitride material 102, 202, 302, 402, 502 and 602 of FIGS. 1, 2, 3, 4, 5, and 6 respectively. The first nitride material 705 is analogous or similar to first nitride material 105, 205, 305, 405, 505, and 605 of FIGS. 1, 2, 3, 4, 5, and 6 respectively. The second nitride material 708 is analogous or similar to second nitride material 108, 208, 308, 408, 508, and 608 of FIGS. 1, 2, 3, 4, 5, and 6. The openings 732-1, 732-2, referred to as openings 732, are analogous or similar to openings 432, 532, and 632 of FIGS. 4, 5, and 6 respectively. The storage node material 721 is analogous or similar to storage node material 521 and 621 of FIGS. 5 and 6 respectively.

As is illustrated in FIG. 7, a bottom electrode material 736 has been formed (e.g., deposited) on the sidewalls of the openings (e.g., 632-1, 632-2, illustrated in FIG. 6). The storage node material 721 may fill the openings from the bottom nitride material 702-1, 702-2, and 702-3 to a height 720 of the openings 732-1 and 732-2 at the upper surface of the plurality of semiconductor support structures (e.g., 509-1, 509-2, and 509-N in FIG. 5).

In a number of examples, the bottom electrode material 736 may be formed from conductive materials and to various widths (e.g., thicknesses) as suited to a particular design rule for the formation of an operable capacitor for a semiconductor device. The storage node material 721 may be covered on its sidewalls with the bottom electrode material 736. The bottom electrode material 736 may be used to store a charge. As an example, the height 720 of the bottom electrode material 736 spans the height 724-1 of the bottom nitride material 702, the height 724-2 of the removed first silicate material (for example, 603-1, 603-2, and 603-3 of FIG. 6), the height 724-3 of first nitride material 702-1, 702-2, and 702-3, the height 724-4 of the removed second silicate material (for example, 606-1, 606-2, and 606-3 of FIG. 6), the height 724-5 of the second nitride material 708-1 and 708-2, and the height 724-6 of the removed third silicate material (for example, 612-1, 612-2, and 612-3 of FIG. 6) that, when added together, results in the overall height 720. As shown in FIG. 7, a dielectric material 723 has been formed (e.g., deposited) on an outer surface of the bottom electrode material 736. The dielectric material 723 may, in a number of examples, be formed from a surface of the RDL material 701 to cover the outer surface, including an upper surface, of the storage node material 721.

Figure 8:
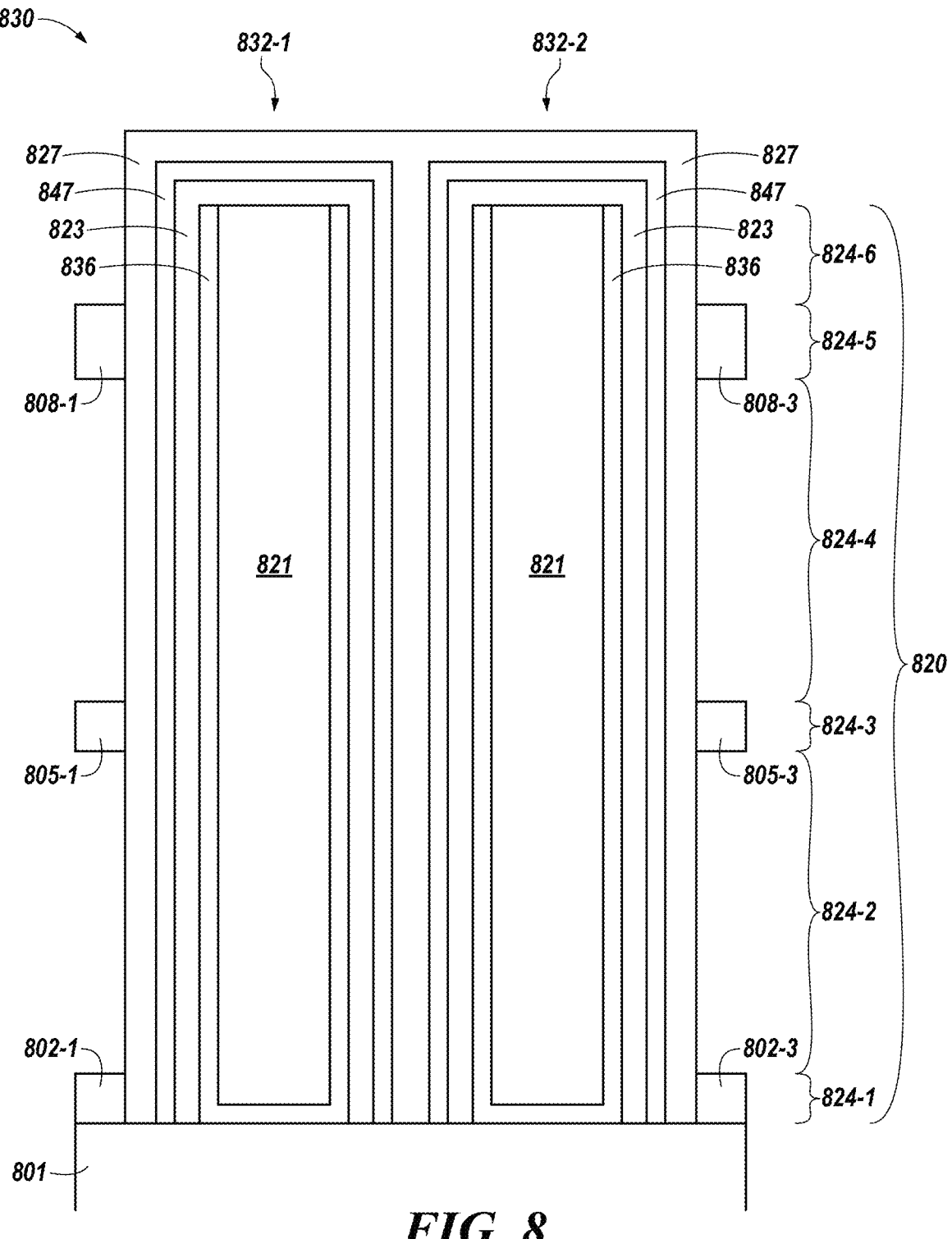

FIG. 8 illustrates a cross-sectional view 831 of a portion of an example semiconductor structure of a memory device in association with a semiconductor fabrication sequence for depositing a storage node in accordance with a number of examples of the present disclosure. FIG. 8 illustrates the example semiconductor structure following completion of the example fabrication sequence described in connection with FIG. 7.

The cross-sectional view 831 can include the same or similar elements as the example cross-sectional view 100 as referenced in FIG. 1, the example cross-sectional view 211 as referenced in FIG. 2, the example cross-sectional view 304 as referenced in FIG. 3, the example cross-sectional view 413 as referenced in FIG. 4, the example cross-sectional view 507 as referenced in FIG. 5, the example cross-sectional view 630 as referenced in FIG. 6, and the example cross-sectional view 713 as referenced in FIG. 7. For example, the RDL material 801 is analogous or similar to RDL material 101, 201, 301, 401, 501, 601, and 701 of FIGS. 1, 2, 3, 4, 5, 6, and 7 respectively. The bottom nitride material 802 is analogous or similar to bottom nitride material 102, 202, 302, 402, 502, 602, and 702 of FIGS. 1, 2, 3, 4, 5, 6, and 7 respectively. The first nitride material 805 is analogous or similar to first nitride material 105, 205, 305, 405, 505, 605, and 705 of FIGS. 1, 2, 3, 4, 5, 6, and 7 respectively. The second nitride material 808 is analogous or similar to second nitride material 108, 208, 308, 408, 508, 608, and 708 of FIGS. 1, 2, 3, 4, 5, 6, and 7 respectively. The openings 832-1, 832-2, referred to as openings 832, are analogous or similar to openings 432, 532, 632, and 732 of FIGS. 4, 5, 6, and 7 respectively. The bottom electrode 836 is analogous or similar to silicon fill material 736 of FIG. 7. The storage node material 821 is analogous or similar to storage node material 521, 621, and 721 of FIGS. 5, 6, and 7, respectively.

As shown, the dielectric material 823 has been formed (e.g., deposited) on an outer surface of the bottom electrode material 836. The dielectric material 823 may, in a number of examples, be formed from a surface of the RDL material 801 to cover the outer surface, including an upper surface, of the bottom electrode material 836. A capacitor material may be subsequently formed, at least in part, by formation (e.g., deposition) of a second electrode material 847 on an outer surface of the dielectric material 823. The height 820 of the silicon fill material 821 spans the height 824-1 of the bottom nitride material 802-1 and 802-3, the height 824-2 of the removed first silicate material, the height 824-3 of first nitride material 805-1 and 805-3, the height 824-4 of the removed second silicate material, the height 824-5 of the second nitride material 808-1 and 808-3, and the height 824-6 of the removed third silicate material that, when added together, results in the overall height 820.

The example semiconductor structure illustrated in FIG. 8 shows a buffer material 827 that may be formed around and between the capacitor materials as a conductive material between cells. The dielectric material 823, the second storage node material 847, and the buffer material 827 may be formed from various respective dielectric materials, conductive materials, and resistive materials and to various width (e.g., thickness) usable in association with formation of an operable silicon fill material for a semiconductor device.

The support structure is formed from the bottom nitride material 802-1 and 802-3, first nitride material 805-1 and 805-3, and the second nitride material 808-1 and 808-3. The support structure may provide support to the capacitor materials after the removal of the first, second, and third silicate materials (e.g., 503, 506, and 512 in FIG. 5) has left voids even after such voids may have been at least partially filled by the buffer material 827. The support structure formed from the bottom nitride material 802-1 and 802-3, the first and second nitride materials 805-1 and 805-3, and 808-1 and 808-3 is shown for ease of illustration in what can be a 3D-cross sectional view to be supporting behind the storage node material 821. In a number of examples, the dielectric material 823, the second storage node material 847, and/or the buffer material 827 may surround the storage node material 821 except at defined positions where bottom nitride material 802-1 and 802-3, the first and second nitride materials 805-1 and 805-3, and 808-1 and 808-3 of the support structures are attached to the storage node material 821.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 9:
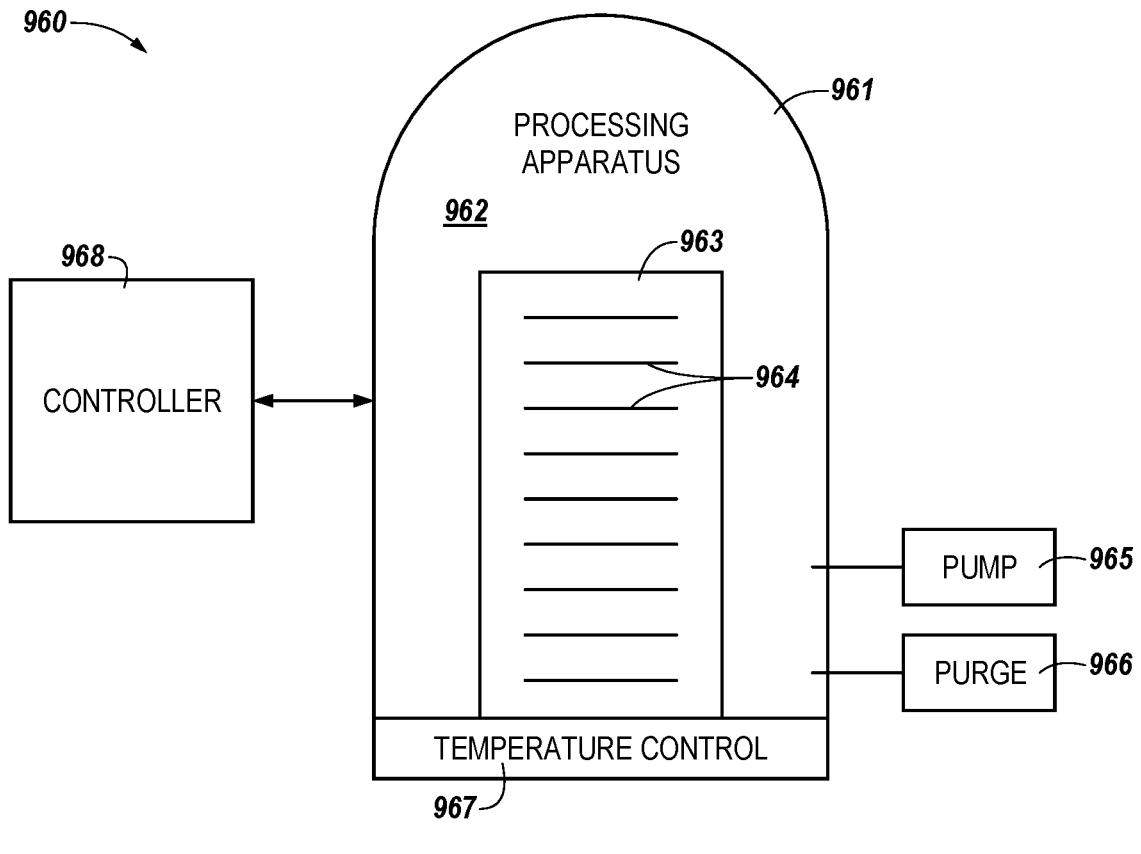
FIG. 9 is a functional block diagram of a system for implementation of an example semiconductor fabrication process in accordance with a number of embodiments of the present disclosure.

FIG. 9 is a functional block diagram of a system 960 for implementation of an example semiconductor fabrication process in accordance with a number of embodiments of the present disclosure. The system 960 can include a processing apparatus 961. The processing apparatus 961 can be configured to enable depositing a storage node material.

The processing apparatus 961 can include a semiconductor processing chamber 962 to enclose components configured to deposit a storage node material. The chamber 962 can further enclose a carrier 963 to hold a batch of semiconductor wafers 964 (e.g., the bottom nitride material 102). The processing apparatus 961 can include and/or be associated with tools including, for example, a pump 965 unit and a purge 966 unit configured to introduce and remove reactants. In one example, the reactants may include precursors/reducing agents. The processing apparatus 961 can further include a temperature control 967 unit configured to maintain the chamber 962 at appropriate temperatures as described herein.

The system 960 can further include a controller 968. The controller 968 can include, or be associated with, circuitry and/or programming for implementation of, for instance, depositing a storage node material. Adjustment of such deposition and purging operations by the controller 968 can control the thickness of the materials described herein (the substrate material, the first silicate material, the first nitride material, the second silicate material, the second nitride material, and the third silicate material).

The controller 968 can, in a number of embodiments, be configured to use hardware as control circuitry. Such control circuitry may, for example, be an application specific integrated circuit (ASIC) with logic to control fabrication steps, via associated deposition and purge processes, for depositing a storage node material.

Figure 10:
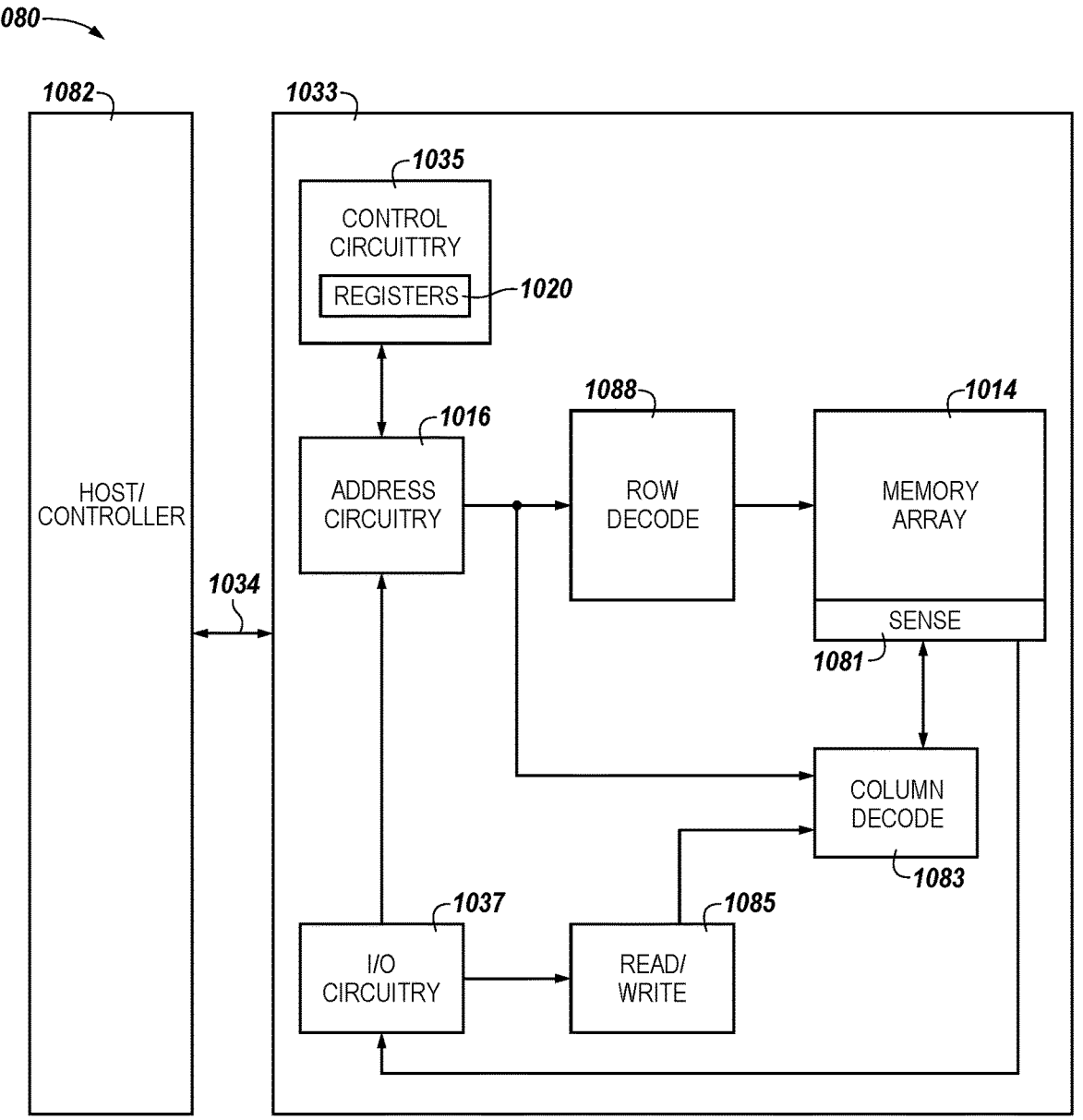
FIG. 10 illustrates a block diagram of an apparatus in the form of a computing system including a memory device in accordance with a number of embodiments of the present disclosure.

FIG. 10 is a block diagram of an apparatus in the form of a computing system 1080 including a memory device 1033 in accordance with a number of embodiments of the present disclosure. As used herein, a memory device 1033, a memory array 1014, and/or a host 1082, for example, might also be separately considered an "apparatus." According to embodiments, the memory device 1082 may comprise at least one memory array 1014 with a memory cell formed having a digit line and body contact, according to the embodiments described herein.

In this example, system 1080 includes a host 1082 coupled to memory device 1033 via an interface 1034. The computing system 1080 can be a personal laptop computer, a desktop computer, a digital camera, a mobile telephone, a memory card reader, or an Internet-of-Things (IoT) enabled device, among various other types of systems. Host 1082 can include a number of processing resources (e.g., one or more processors, microprocessors, or some other type of controlling circuitry) capable of accessing memory 1033. The system 1080 can include separate integrated circuits, or both the host 1082 and the memory device 1033 can be on the same integrated circuit. For example, the host 1082 may be a system controller of a memory system comprising multiple memory devices 1033, with the system controller 1035 providing access to the respective memory devices 1033 by another processing resource such as a central processing unit (CPU).

In the example shown in FIG. 10, the host 1082 is responsible for executing an operating system (OS) and/or various applications (e.g., processes) that can be loaded thereto (e.g., from memory device 1033 via controller 1035). The OS and/or various applications can be loaded from the memory device 1033 by providing access commands from the host 1082 to the memory device 1033 to access the data comprising the OS and/or the various applications. The host 1082 can also access data utilized by the OS and/or various applications by providing access commands to the memory device 1033 to retrieve said data utilized in the execution of the OS and/or the various applications.

For clarity, the system 1080 has been simplified to focus on features with particular relevance to the present disclosure. The memory array 1014 can be a DRAM array comprising at least one memory cell having a digit line and body contact formed according to the techniques described herein. For example, the memory array 1014 can be a 4F2 array. The array 1014 can comprise memory cells arranged in columns coupled by word lines (which may be referred to herein as access lines or select lines) and rows coupled by digit lines (which may be referred to herein as sense lines or data lines). Although a single array 1014 is shown in FIG. 10, embodiments are not so limited. For instance, memory device 1033 may include a number of arrays 1014 (e.g., a number of banks of DRAM cells).

The memory device 1033 includes address circuitry 1016 to latch address signals provided over an interface 1034. The interface can include, for example, a physical interface employing a suitable protocol (e.g., a data bus, an address bus, and a command bus, or a combined data/address/command bus). Such protocol may be custom or proprietary, or the interface 1034 may employ a standardized protocol, such as Peripheral Component Interconnect Express (PCIe), Gen-Z, CCIX, or the like. Address signals are received and decoded by a row decoder 1088 and a column decoder 1083 to access the memory array 1014. Data can be read from memory array 1014 by sensing voltage and/or current changes on the sense lines using sensing circuitry 1081. The sensing circuitry 1081 can comprise, for example, sense amplifiers that can read and latch a page (e.g., row) of data from the memory array 1014. The I/O circuitry 1037 can be used for bi-directional data communication with the host 1082 over the interface 1034. The read/write circuitry 1085 is used to write data to the memory array 1014 or read data from the memory array 1014. As an example, the circuitry 1085 can comprise various drivers, latch circuitry, etc.

Control circuitry 1035 decodes signals provided by the host 1082. The signals can be commands provided by the host 1082. These signals can include chip enable signals, write enable signals, and address latch signals that are used to control operations performed on the memory array 1014, including data read operations, data write operations, and data erase operations. In various embodiments, the control circuitry 1035 is responsible for executing instructions from the host 1082. The control circuitry 1035 can comprise a state machine, registers 1020, a sequencer, and/or some other type of control circuitry, which may be implemented in the form of hardware, firmware, or software, or any combination of the three. In some examples, the host 1082 can be a controller external to the memory device 1033. For example, the host 1082 can be a memory controller which is coupled to a processing resource of a computing device.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to shaping a storage node material have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to shaping a storage node than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
forming a semiconductor structure including a support structure having:
a first silicate material over a bottom nitride material;
a first nitride material over the first silicate material;
a second silicate material over the first nitride material; and
a second nitride material over the second silicate material;
removing portions of the second nitride material;
removing an upper portion of the second silicate material;
depositing a third silicate material over the second nitride material, over the upper portion of the second silicate material, and through the second nitride material;
forming an opening through the semiconductor structure; and
depositing a storage node material within the opening.

2. The method of claim 1, wherein removing the portions of the second nitride material comprises forming the opening through the second nitride material.

3. The method of claim 1, further comprising removing the first silicate material, the second silicate material, and the third silicate material subsequent to depositing the storage node material.

4. The method of claim 1, wherein the first silicate material, the second silicate material, and the third silicate material consist of one of a borophosphosilicate glass (BPSG) material and a tetraethyl orthosilicate (TEOS) material.

5. The method of claim 1, further comprising forming a height of the semiconductor structure to a height of greater than 10,000 Angstroms.

6. The method of claim 1, further comprising planarizing the third silicate material to determine a height of the semiconductor structure.

7. The method of claim 1, further comprising forming a third nitride material over the third silicate material.

8. The method of claim 1, wherein depositing the storage node material comprises depositing a silicon fill material.

9. A method, comprising:
forming a support structure for a semiconductor structure having:
a first silicate material over a bottom nitride material;
a first nitride material over the first silicate material;
a second silicate material over the first nitride material; and
a second nitride material over the second silicate material;
removing portions of the second nitride material;
removing an upper portion of the second silicate material;
depositing a third silicate material over the second nitride material, over the upper portion of the second silicate material, and through the second nitride material;
forming an opening through the semiconductor structure;
depositing a storage node material within the opening; and
removing the first silicate material, the second silicate material, and the third silicate material.

10. The method of claim 9, further comprising forming the second silicate material and the third silicate material from the same material.

11. The method of claim 9, further comprising forming the third silicate material from an oxide material.

12. The method of claim 9, further comprising forming the second silicate material and the third silicate material from a tetraethyl orthosilicate (TEOS) material.

13. The method of claim 9, further comprising depositing an electrode material within the opening.

14. The method of claim 13, wherein depositing the electrode material comprises depositing a titanium nitride (TiN) material.

15. The method of claim 9, wherein the portions of the second nitride material are removed with a solvent selective only to the second nitride material.

* * * * *